United States Patent
Bittle et al.

(10) Patent No.: US 12,339,331 B2
(45) Date of Patent: Jun. 24, 2025

(54) THIN FILM MAGNETIC FIELD VECTOR SENSOR

(71) Applicant: Government of the United States of America, as represented by the Secretary of Commerce, Gaithersburg, MD (US)

(72) Inventors: Emily Geraldine Bittle, Bethesda, MD (US); David James Gundlach, Montgomery Village, MD (US); Sebastian Engmann, Gaithersburg, MD (US)

(73) Assignees: GUVERNMENT OF THE UNITED STATES OF AMERICA, AS REPRESENTED BY THE SECRETARY OF COMMERCE, Gaithersburg, MD (US); THEISS RESEARCH, La Jolla, CA (US)

( * ) Notice: Subject to any disclaimer, the term of this patent is extended or adjusted under 35 U.S.C. 154(b) by 167 days.

(21) Appl. No.: 18/116,274

(22) Filed: Mar. 1, 2023

(65) Prior Publication Data

US 2023/0280418 A1   Sep. 7, 2023

Related U.S. Application Data

(60) Provisional application No. 63/315,475, filed on Mar. 1, 2022.

(51) Int. Cl.
*G01R 33/032* (2006.01)
*H10K 39/34* (2023.01)

(52) U.S. Cl.
CPC .......... *G01R 33/032* (2013.01); *H10K 39/34* (2023.02)

(58) Field of Classification Search
CPC ............................. G01R 33/032; Y02E 10/549
See application file for complete search history.

(56) References Cited

U.S. PATENT DOCUMENTS

| | | | | |
|---|---|---|---|---|
| 2002/0027206 A1* | 3/2002 | Yuan | ...................... | H01L 31/173 257/E31.109 |
| 2004/0178325 A1* | 9/2004 | Forrest | ................. | H10K 30/211 250/214 R |
| 2009/0129724 A1* | 5/2009 | Carter | .................... | H10K 59/13 313/504 |

(Continued)

OTHER PUBLICATIONS

Bittle, E.G., et al., "Measuring the impact of spin-triplet exciton orientation on photocurrent in an organic transistor", Journal of Materials Chemistry C, 2021, p. 11809-11814, vol. 9.

(Continued)

*Primary Examiner* — Akm Zakaria
(74) *Attorney, Agent, or Firm* — Office of Chief Counsel for National Institute of Standards and Technology

(57) ABSTRACT

A novel magnetic field sensor (MFS) may be created with an organic light emitting diode (OLED) made from an organic semiconductor material and an organic photodetector (OPD) built directly on top (or below) of the OLED, wherein at least one layer is made from an oriented molecular or polymer organic semiconductor material with strong magnetic anisotropy, and which material has a magneto-resistive or magneto-electroluminescent signal that varies with the magnitude and direction of a magnetic field to allow for measuring the vector of the external magnetic field.

13 Claims, 2 Drawing Sheets

(56) References Cited

U.S. PATENT DOCUMENTS

| | | | | |
|---|---|---|---|---|
| 2010/0148160 A1* | 6/2010 | Cao | ............... | H10K 59/874 |
| | | | | 257/40 |
| 2013/0215496 A1* | 8/2013 | Ban | ............... | H01L 31/14 |
| | | | | 359/345 |
| 2014/0367572 A1* | 12/2014 | So | ............... | H10K 85/311 |
| | | | | 257/40 |
| 2017/0030981 A1* | 2/2017 | Lynde | ............... | H10N 50/01 |
| 2018/0151843 A1* | 5/2018 | Ma | ............... | H10K 50/858 |
| 2020/0403162 A1* | 12/2020 | Luo | ............... | H10K 85/636 |
| 2022/0085336 A1* | 3/2022 | Hyun | ............... | H10K 59/879 |
| 2023/0133787 A1* | 5/2023 | Jung | ............... | C09K 11/06 |
| | | | | 257/40 |
| 2023/0154318 A1* | 5/2023 | Nguyen | ............... | G01R 33/032 |
| | | | | 324/244.1 |

OTHER PUBLICATIONS

Engmann, S., et al., "The role of orientation in the MEL response of OLEDs", Journal of Materials Chemistry C, 2021, p. 10052-10064, vol. 9.

* cited by examiner

THIN FILM MAGNETIC FIELD VECTOR SENSOR

CROSS REFERENCE TO RELATED APPLICATIONS

The application claims the benefit of U.S. Provisional Patent Application Ser. No. 63/315,475 (filed Mar. 1, 2022), which is herein incorporated by reference in its entirety.

This invention was made with United States Government support from the National Institute of Standards and Technology (NIST), an agency of the United States Department of Commerce. The Government has certain rights in this invention.

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

BRIEF DESCRIPTION

Disclosed is a novel, all organic magnetic field sensor comprising an organic light emitting diode (OLED) and an organic photodetector (OPD). The sensor function is believed to be driven by the large magneto-electroluminescence (MEL) of an OLED, but the function of the present invention is not limited to this belief. In certain embodiments, the OPD is based on a solution processed organic absorber layer. In other embodiments, similar structures may be fabricated using sequential sublimed or thermally evaporated thin films. In certain embodiments, the OLED and OPD of the invention are separated from each other by a thin dielectric spacer layer. In other embodiments, the dielectric spacer layer is not required.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

A detailed description of one or more embodiments is presented herein by way of exemplification and not limitation.

It has been discovered that a novel magnetic field sensor (MFS) may be created with an organic light emitting diode (OLED) made from an organic semiconductor material and an organic photodetector (OPD) built directly on top (or below) of the OLED, wherein either the OLED or the OPD is made from an oriented molecular or polymer organic semiconductor material with strong magnetic anisotropy, and which material has a magneto-resistive or magneto-electroluminescent signal that varies with the directionality and magnitude of a magnetic field. When electricity is applied to the MFS, the OLED outputs light which is measured as current at the OPD. The current output of the OPD may then be measured to determine the magnetic field strength in reference to a calibration curve. Changes to the output current is used to detect the external magnetic field direction and magnitude. It is believed that the MFS uses the magnetic dependence of optical signals (luminescence) to measure a magnetic field by means of an OLED and OPD acting together, although the present invention is not limited to this proposed mechanism.

The MFS of this invention features a magnetically oriented layer to allow for measuring of the direction of the external magnetic field in addition to its magnitude. Direction of field is used to align sensors in applications such as smart phones to determine the direction with respect to the Earth's magnetic field for GPS and other features.

Figure 1:
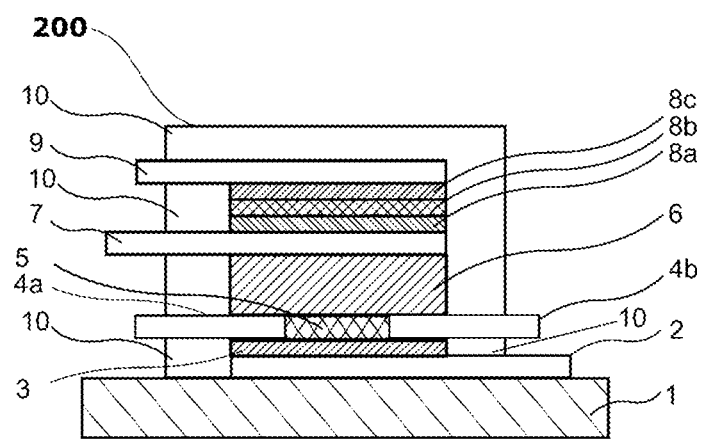
FIG. 1 shows a cross-sectional and perspective view of a magnetic field sensor, according to some embodiments.
Figure 2:
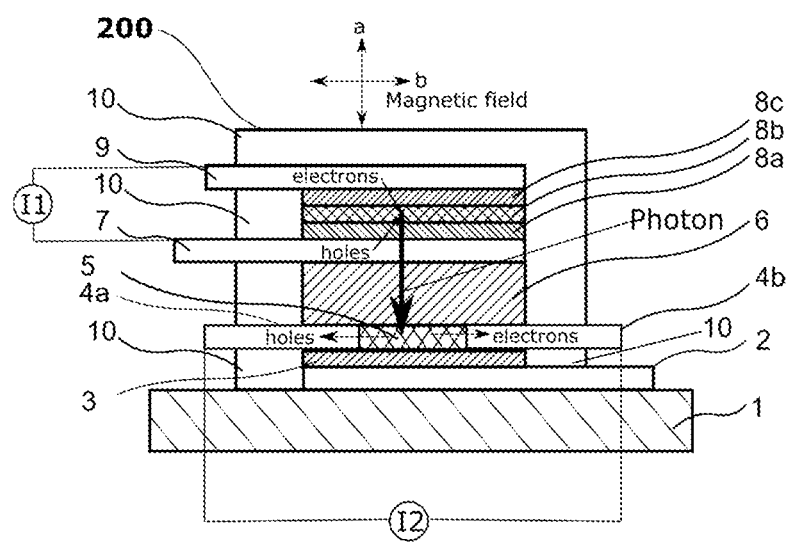
FIG. 2 shows a scheme for operation of a magnetic field sensor, according to some embodiments.

In an embodiment, with reference to FIG. 1 and FIG. 2, includes:

In one embodiment, a magnetic field sensor (MFS) 200 using an OLED 8 (comprising subparts 8a-8c) built directly on top of an OPD (comprising parts 2-5), where the OPD is demonstrated as a three-terminal transistor (two-terminal OPDs are also possible and contemplated within the scope of this invention). A substrate 1 supports the sensor, and may be composed of flexible or rigid materials. The main components of the sensor are the OLED 8a-8c and the OPD 2-5. The OLED 8 consists of an emitter layer 8b surrounded by a hole injection/electron blocking layer 8a and an electron injecting/hole blocking layer 8c. The OLED 8 and OPD 2-5 are separated by an electrically insulating layer 6. The OPD is demonstrated here as a transistor made of a light sensitive semiconductor 5, metal electrodes for charge injection 4a and extraction 4b, a metal gate electrode 2, and an insulating dielectric layer 3.

In one embodiment, the oriented, magnetic field sensitive semiconductor must be placed in either layer 8b or 5 and is comprised of materials including but not limited to: single crystal semiconductors, aligned polymer films, and aligned small molecule films.

In one embodiment, the oriented magnetic field sensitive semiconductor may be made by various processes, including but not limited to: standard crystallization techniques; blade coating; stretch alignment; and physical vapor deposition. Layers 7 and 9 are metal electrodes used to electrically drive the OLED, with layer 7 being fully transparent or semi-transparent to the light generated in the OLED. Layer 10 is an encapsulation layer to protect the sensor from environmental influences.

In one embodiment, the encapsulation layer 10 can be either rigid or flexible and might incorporate stabilizing compounds such as radical scavengers, getter materials, or antioxidants that aim to increase the sensor's lifetime by preventing chemical degradation of organic compounds that compromise the MFS 200 due to environmental influences.

In one embodiment, layers compromising the OPD stack 2-5 and OLED stack 8a-8c can be processed via various methods, including but not limited to: physical vapor deposition (PVD); chemical vapor deposition (CVD); and solution deposition techniques (spin-coating, slot-die-coating, spray-coating, etc).

In one embodiment, the MFS 200 is operated in the following manner, following FIG. 2. Current is applied at I1 to inject holes and electrons into layer 8 which then produces photons. Photons are then absorbed in layer 5 which produces electrons and holes in response. The electrons and holes modulate the current detected at I2, as collected from contacts 4a and 4b. The final current is amplified by applying a voltage to contact 2 in the three-terminal example of the MFS 200. The final signal can be referenced to a calibration curve to determine the direction and amplitude of the external magnetic field, shown in two directions a and b.

In current applications, when direction and magnitude of a magnetic field are to be measured, it is typical to use an integrated set of three Hall sensors. By using the optical output or light detection response of an oriented molecular or polymer film to detect magnetic fields with an integrated stack of OLED and OPD, this invention allows for the novel use of a single sensor using optical signals to measure magnetic field magnitude and orientation.

Use of a single MFS for magnetic field magnitude and orientation measurement cuts down on the power usage compared to the use of three integrated Hall sensors which are now the industry standard and in widespread use, for example, in smart phone technology. In the case of smart phone applications, the use of a single MFS would translate to longer battery life.

Further, the solubility of the materials used to make the MFS that is the subject of this invention allows this sensor to be printed as opposed to being produced through the standard lithography process. Printed electronics can be integrated into a wider variety of substrates, such as plastics and paper, and allow for broader accessibility of repeatable circuit board manufacturing, allowing for smaller scale development for individual users and small businesses, similar to the opportunities presented by 3D printing. Printed electronics are projected to be used more widely in conjunction with technology associated with the Internet of Things.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

The invention claimed is:

1. A magnetic field sensor, the magnetic field sensor comprising:
    a substrate which supports the components of the magnetic field sensor;
    an organic photodetector; and
    an organic light emitting diode;
    wherein the organic photodetector and the organic light emitting diode are arranged in layers;
    wherein the organic light emitting diode is oriented to emit photons towards the organic photodetector;
    wherein the organic photodetector further comprises an insulating dielectric layer and a metal gate electrode;
    wherein the organic light emitting diode further comprises a hole injection/electron blocking layer and an electron injecting/hole blocking layer; and
    wherein at least one of the organic photodetector and the organic light emitting diode is a magnetic field sensitive semiconductor comprised of materials including but not limited to: single crystal semiconductors, aligned polymer films, and aligned small molecule films.

2. The magnetic field sensor of claim 1, wherein the substrate is rigid.

3. The magnetic field sensor of claim 1, wherein the substrate is flexible.

4. The magnetic field sensor of claim 1, further comprising:
    a back contact and an optically semitransparent or transparent front contact electrically coupled to the organic light emitting diode.

5. The magnetic field sensor of claim 1, further comprising a set of contacts electrically coupled to the organic photodetector.

6. The magnetic field sensor of claim 1, further comprising an insulating layer encompassing the organic light emitting diode and the organic photodetector.

7. The magnetic field sensor of claim 6, wherein the insulating layer further comprises radical scavengers, getter materials, or antioxidants.

8. A method for detecting a magnitude of an external magnetic field, the method comprising:
    exposing a magnetic field sensor comprising an organic light emitting diode and an organic photodetector to an external magnetic field;
    applying current through a first set of electrical contacts to the organic light emitting diode, producing photons; and
    detecting the photons with the organic photodetector;

wherein the organic photodetector and the organic light emitting diode are arranged in layers;

wherein the organic light emitting diode is oriented to emit photons towards the organic photodetector;

wherein the organic photodetector on detection of the photons produces a current which is extracted through a second set of electrical contacts;

wherein at least one of the organic photodetector and the organic light emitting diode is a magnetic field sensitive semiconductor comprised of materials including but not limited to: single crystal semiconductors, aligned polymer films, and aligned small molecule films;

wherein number of photons produced by the organic light emitting diode is modulated by the magnitude of the external magnetic field;

wherein magnitude of the current output from the second set of electrical contacts is reflective of the magnitude of the external magnetic field; and wherein the current output from the second set of electrical contacts is sensitive to an orientation of the magnetic field sensor within the external magnetic field.

9. The method of claim 8, wherein the magnetic field sensor further comprises an insulating dielectric layer and a metal gate electrode.

10. The method of claim 9, wherein the current output from the second set of electrical contacts is amplified by the application of a voltage to the metal gate electrode.

11. The method of claim 8, wherein the magnetic field sensor has been calibrated such that, for a known current input to the first set of electrical contacts, the current output from the second set of electrical contacts allows a measurement of the magnitude of the external magnetic field.

12. The method of claim 10, wherein the magnetic field sensor has been calibrated such that, for a known current input to the first set of electrical contacts and a known voltage applied to the metal gate electrode, the current output from the second set of electrical contacts allows a measurement of the magnitude of the external magnetic field.

13. A method for detecting a vector of an external magnetic field, the method comprising:

exposing a magnetic field sensor comprising an organic light emitting diode and an organic photodetector to an external magnetic field;

applying current through a first set of electrical contacts to the organic light emitting diode, producing photons; and detecting the photons with the organic photodetector;

wherein the organic photodetector and the organic light emitting diode are arranged in layers;

wherein the organic light emitting diode is oriented to emit photons towards the organic photodetector;

wherein the organic photodetector on detection of the photons produces a current which is extracted through a second set of electrical contacts;

wherein at least one of the organic photodetector and the organic light emitting diode is a magnetic field sensitive semiconductor comprised of materials including but not limited to: single crystal semiconductors, aligned polymer films, and aligned small molecule films;

wherein number of photons produced by the organic light emitting diode is modulated by a magnitude of the external magnetic field;

wherein magnitude of the current output from the second set of electrical contacts is reflective of the magnitude of the external magnetic field;

wherein the current output from the second set of electrical contacts is sensitive to an orientation of the magnetic field sensor within the external magnetic field; and wherein the direction and the magnitude of the external magnetic field is determined by reference to a calibration curve for a known current input to the first set of electrical contacts and a known voltage applied to the metal gate electrode.

* * * * *